(12) United States Patent
Paluck

(10) Patent No.: US 6,465,914 B1
(45) Date of Patent: Oct. 15, 2002

(54) MICROCONTROLLER POWER REMOVAL RESET CIRCUIT

(75) Inventor: Paul Paluck, Orland Park, IL (US)

(73) Assignee: Capable Controls, Inc., Bensenville, IL (US)

( * ) Notice: Subject to any disclaimer, the term of this patent is extended or adjusted under 35 U.S.C. 154(b) by 0 days.

(21) Appl. No.: 09/521,847

(22) Filed: Mar. 9, 2000

(51) Int. Cl.[7] .............................. H01H 3/26; H01H 3/06
(52) U.S. Cl. ........................................ 307/140; 361/92
(58) Field of Search ........................ 307/140; 327/513; 361/93.09, 92, 88, 90, 98; 323/276, 277, 274, 280

(56) References Cited

U.S. PATENT DOCUMENTS

| | | | | |
|---|---|---|---|---|
| 4,019,096 A | * | 4/1977 | Bullinga | 323/277 |
| 4,401,898 A | * | 8/1983 | Sommerer | 327/513 |
| 4,520,418 A | * | 5/1985 | Susi | 361/92 |
| 4,914,542 A | * | 4/1990 | Wagoner | 361/98 |
| 6,147,849 A | * | 11/2000 | Wullink | 361/93.9 |
| 6,184,664 B1 | * | 2/2001 | Ponzetta | 323/274 |

* cited by examiner

*Primary Examiner*—Rajnikant B. Patel
(74) *Attorney, Agent, or Firm*—Schiff Hardin & Waite

(57) ABSTRACT

In a method and apparatus for power removal from a control circuit of an application circuit where that application circuit, as a result of a triggering event, can create damaging noise in the control circuit, a power supply is provided for the control circuit. Power is supplied from the power supply to the control circuit until initiation of the triggering event. Upon initiation of the triggering event, power flow is stopped to the control circuit for a predetermined time delay sufficient so that after the triggering event has ceased, transient noises which may still be present after the triggering event do not harm the control circuit or produce incorrect operation. At the end of the time delay, power is reconnected to the control circuit. Preferably, the control circuit is a microcontroller connecting to an ignition circuit for firing a gas chamber in a gas powered fastener gun.

18 Claims, 2 Drawing Sheets

MICROCONTROLLER POWER REMOVAL RESET CIRCUIT

BACKGROUND OF THE INVENTION

Gas fired ignitable fuel powered appliances are Known such as power tools, motor devices, or weapons where fuel is ignited by an electrical spark discharge. Such devices may be controlled by an electronic control circuit which is sensitive to noise.

It has been Known in such devices to interrupt the power to the control circuitry with a reset circuit as illustrated in prior art FIG. 1. Input 1 receives a trigger signal indicative of the electrical spark discharge for igniting the fuel. This trigger signal is connected through resistor 2 to a transistor 3 biased by a resistor 4 from a voltage source 5. This trigger signal switches transistor 3 so that at the output 6 power being supplied to the circuit is temporarily disconnected only while the trigger signal is present.

It is a disadvantage of the prior art circuit that transient noises or interferences may still remain even after an event such as fuel ignition by electrical spark discharge has occurred. Damage can still result to the control circuitry.

SUMMARY OF THE INVENTION

It is an object of the present invention to improve on the prior art reset circuits to provide further protection even after an initial triggering event has occurred.

The present invention provides an ordered and time controlled power interruption to a microcontroller or other logic control circuit or device controlling an application circuit or device. The invention has its primary and preferred use in an electronic control in a gas-fuel impact fastening power tool. However, it is applicable to any device controlled by electronic circuitry that may be sensitive to electrical noise caused by arcs or other events triggering damaging voltage or current pulses which may remain even after the trigger event. According to the invention, a microcontroller power removal reset circuit is provided (hereinafter known as the MPRRC) which is used both to maintain and remove electrical power from the application circuit.

The microcontroller ;power removal reset circuit (MPRRC) of the invention reduces or eliminates the risk of an electrical noise induced malfunction in a control logic system or microcontroller. It accomplishes this by causing a time related and time controlled removal of power to the protected circuit or device in response to some electrical event. The MPRRC thus removes power from the application circuit or device, stopping its operation during the electrical noise event. This eliminates the need for an electronic supervisory and fault recovery circuit commonly called a "watchdog" circuit, as in the prior art.

It is a particular improvement of the invention that by providing a time delay element a time delay feature allows a waiting period for system transient noise to pass before power is reapplied to the application circuit. Prior art circuitry had no such time delay reset function. In the prior art, a transient noise can still be present when power is reapplied to the application circuitry.

BRIEF DESCRIPTION OF THE DRAWINGS

FIG. 3 is a block diagram of a particular application of the microcontroller power removal reset circuit of the invention in a gas powered fastener gun.

DESCRIPTION OF THE PREFERRED EMBODIMENTS

Figure 1:
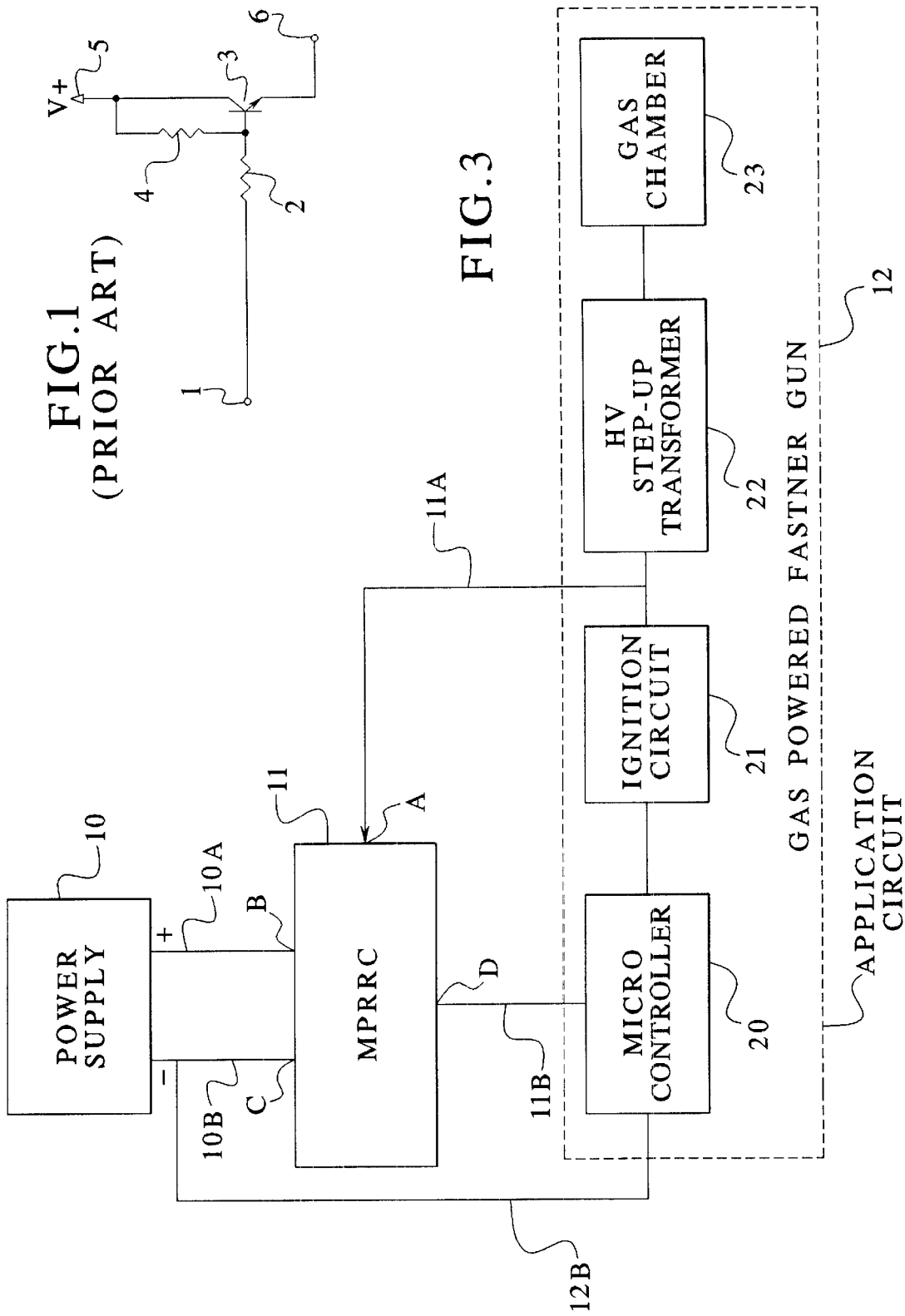
FIG. 1 is a schematic illustration of a prior art reset circuit.
Figure 2:
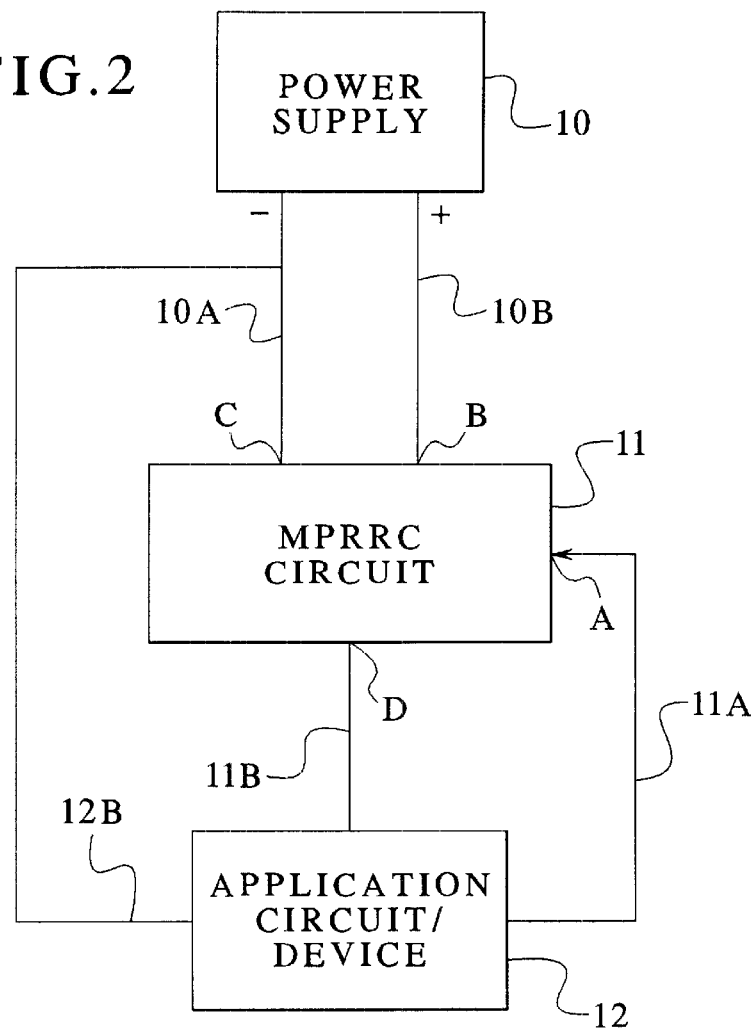
FIG. 2 is a block diagram of the general application of the microcontroller power removal reset circuit according to the present invention.

The microcontroller power removal reset circuit (MPRRC) of the invention is shown in a general application in FIG. 2 wherein a power supply 10 is connected by plus and minus leads 10B and 10A (10A being ground, for example) to MPRRC circuit power input terminals B and C. The MPRRC circuit controls supply of power via line 11 B at terminal D to the application circuit/device 12 to be protected. The ground lead 10A is also connected via line 12B to the application circuit/device 12. An output from the application circuit/device indicating a triggering event is coupled via line 11A to the input terminal A of the MPRRC circuit.

FIG. 3 shows a more particular application of the invention to a gas powered fastener gun wherein similar reference numerals have been retained. In the gas powered fastener gun, a microcontroller 20 receives power via the line 11B from the MPRRC 11. The microcontroller sends a signal to the ignition circuit 21 which in turn feeds a high voltage pulse by use of a step-up transformer 22 to a gas chamber 23. At the output of the ignition circuit, the input line 11A provides a triggering signal to the MPRRC 11.

Figure 4:
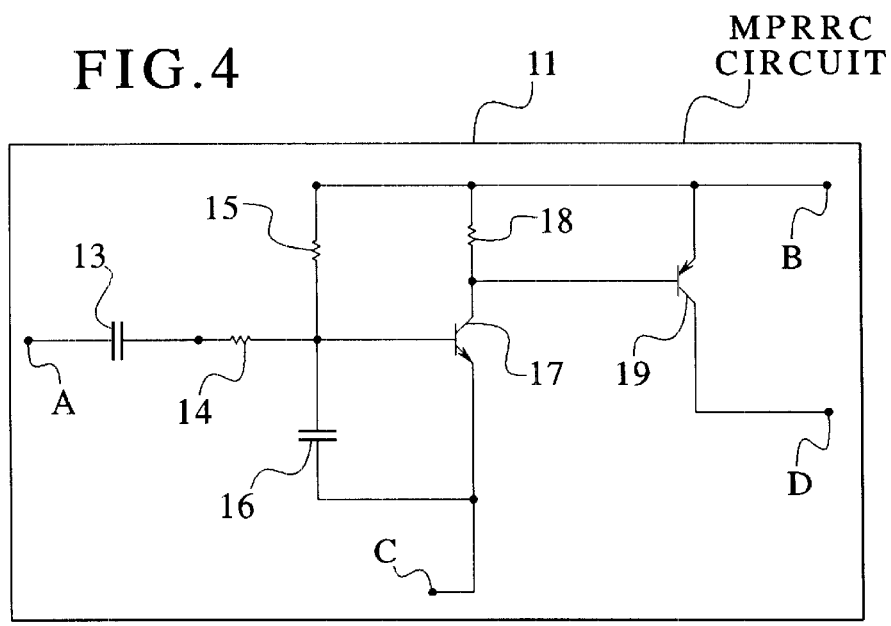
FIG. 4 is a schematic illustration of the microcontroller power removal reset circuit of the invention.

FIG. 4 shows the schematic diagram of the MPRRC circuit 11 in detail.

With the initial application of power to the MPRRC 11, the circuit's input B is in the on state. This provides a path for electrical current from output terminal D to the control circuit, more specifically, the control logic circuitry, as a microcontroller 20. The microcontroller 20 then starts to operate normally, monitoring various conditions that determine operation of the tool. Upon sensing that the tool is being called on to fire a fastener, the microcontroller 20 enables the ignition circuit 21. The ignition circuit 21 then responds by applying an exciting current pulse to the primary winding of the high voltage step-up type transformer 22. The step-up transformer generates a high voltage pulse (spark) for fuel ignition in gas chamber 23. A sample of this exciting current pulse is taken and applied via input line 1 1A as a triggering signal to the input A of the MPRRC. The MPRRC responds by switching its output D off, thus removing power from the control logic circuit 20. The action of removing power from the control logic circuit 20 makes it insensitive to the ignition spark electrical noise, for the duration of time the MPRRC holds circuit power off. Following a fixed time delay period the MPRRC restores its output, D to the on state supplying power to the control logic 20. The control logic circuit 20 then begins to function normally as it did prior to the initiation of the spark event.

A more detailed description of the MPRRC will now be provided.

Power is applied on lines 10A and 10B to the MPRRC circuit through connections C and B. Transistor 19 is initially turned off by the pull-up action of resistor 18. Transistor 17 is also initially in the off state. Transistor 17 switches on following a short delay caused by the time constant of capacitor 16 charging through resistor 15. Transistor 17 is held in the on state by current supplied through resistor 15. With transistor 17 on, a current path is established to the base of transistor 19. This switches transistor 19 to the on state. Current now flows through transistor 19 collector to the control logic circuit (load) 20 via connection D. The application of power to the control logic 20 causes it to begin functioning. The control logic 20 now functioning normally will monitor other circuit conditions for an indication to operate the ignition circuit 21. An electrical sample of the signal applied to the ignition transformer's primary circuit is provided on line 11A to the MPRRC through connection A. This will be the MPRRC trigger signal. The sample's negative going edge is coupled into the MPRRC through capacitor 13 and resistor 14 serving as a differentiator. The negative going signal rapidly forces capacitor 16 to discharge toward zero volts. This causes the base drive voltage for transistor 17 at the junction of components 15, 16, and 17 to approach zero. Transistor 17 then switches to the off state, causing transistor 19 to switch to the off state by removal of base current drive. It follows that with transistor 19 switched off, power is removed from the control logic circuit 20, thus suspending circuit operation. During the MPRRC off time, electrical noise produced by the ignition circuit 21 will not interfere with control logic function as it is not operational. Following the negative going edge pulse produced by the ignition circuit 21 the signal appearing at input connection A of the MPRRC will return to a steady state. As the input circuit comprised of capacitor 13 and resistor 14 serves as a differentiator, current flow through 13 and 14 will cease upon input A returning to a steady state.

With current flow no longer continuing through capacitor 13 and resistor 14, capacitor 16 is allowed to charge through resistor 15. Following a delay caused by the time constant of resistor 15 and capacitor 16, the voltage at the base of transistor 17 reaches the turn on threshold. Transistor 17 then switches to the on state.

As the base of transistor 19 is connected to the collector of transistor 17, transistor 19 is caused to switch to the on state. With transistor 19 switched on, the logic control circuit 20 (load) receives power through the collector of transistor 19 via MPRRC connection D.

The invention may be used in applications where there is a need to protect an electronic circuit from periodic electrical noise interference. The MPRRC 11 may be used in microcontroller based and other discrete logic applications, where electrical interference noise may cause incorrect operation or alter electronic memory contents. The enable (trigger) signal to the MPRRC 11 may be a logic signal, low level or, a high level signal such as the high voltage transformer's primary exciting pulse, as described herein.

In an alternate embodiment, the enabling trigger signal for the MPRRC reset circuit can be supplied by the microcontroller directly rather then from the input to the high voltage transformer as shown in FIG. 3.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A reset circuit for power removal from a control circuit controlling an application circuit which generates damaging electrical noise transients which can cause malfunction or destruction of the control circuit when a particular initiation event occurs, comprising:

an input connected to a triggering signal from said application circuit indicative of onset of said initiation event;

a power supply interrupting circuit for stopping a supply of power from a power supply to the control circuit of the application circuit when the signal indicating initiation of the event occurs at the input; and the interrupting circuit having a differentiator connecting the triggering signal to a delay circuit for continuing interruption of power to the control circuit for a desired time interval after the triggering signal has stopped to protect the control circuit from said damaging electrical noise transients which could still be present after the stoppage of the triggering signal.

2. The circuit according to claim 1 wherein the power supply interrupting circuit comprises a first transistor controlled by a second transistor, the second transistor having a time constant circuit associated with it for providing said desired time interval.

3. A reset circuit for power removal from a control circuit controlling an application circuit which generates electrical noise which can cause malfunction or destruction of the control circuit when a particular initiation event occurs, comprising:

an input connected to a triggering signal from said application circuit indicative of onset of said initiation event;

a power supply interrupting circuit for stopping a supply of power from a power supply to the control circuit of the application circuit when the signal indicating initiation of the event occurs at the input;

the interrupting circuit having a delay circuit for continuing interruption of power to the control circuit for a desired time interval after the triggering signal has stopped to protect the control circuit from noise transients which could still be present after the stoppage of the triggering signal;

the power supply interrupting circuit comprises a first transistor controlled by a second transistor, the second transistor having a time constant circuit associated with it for providing said desired time interval; and the delay circuit comprising a series connection of a resistor and capacitor with a junction thereof connecting to a base of the second transistor.

4. A reset circuit for power removal from a control circuit controlling an application circuit which generates electrical noise which can cause malfunction or destruction of the control circuit when a particular initiation event occurs, comprising:

an input connected to a triggering signal from said application circuit indicative of onset of said initiation event;

a power supply interrupting circuit for stopping a supply of power from a power supply to the control circuit of the application circuit when the signal indicating initiation of the event occurs at the input;

the interrupting circuit having a delay circuit for continuing interruption of power to the control circuit for a desired time interval after the triggering signal has stopped to protect the control circuit from noise transients which could still be present after the stoppage of the triggering signal; and the delay circuit comprising a resistor and a capacitor connected to each other.

5. A reset circuit for power removal from a control circuit controlling an application circuit which generates electrical noise which can cause malfunction or destruction of the control circuit when a particular initiation event occurs, comprising:

an input connected to a triggering signal from said application circuit indicative of onset of said initiation event;

a power supply interrupting circuit for stopping a supply of power from a power supply to the control circuit of the application circuit when the signal indicating initiation of the event occurs at the input;

the interrupting circuit having a delay circuit for continuing interruption of power to the control circuit for a desired time interval after the triggering signal has stopped to protect the control circuit from noise transients which could still be present after the stoppage of the triggering signal;

the power supply interrupting circuit comprising a first transistor controlled by a second transistor, the second transistor having a time constant circuit associated with it for providing said desired time interval; and the second transistor having a differentiator connected at an input thereof for feeding the trigger signal thereto.

6. A reset circuit for power removal from a control circuit controlling an application circuit which generates electrical noise which can cause malfunction or destruction of the control circuit when a particular initiation event occurs, comprising:

an input connected to a triggering signal from said application circuit indicative of onset of said initiation event;

a power supply interrupting circuit for stopping a supply of power from a power supply to the control circuit of the application circuit when the signal indicating initiation of the event occurs at the input;

the interrupting circuit having a delay circuit for continuing interruption of power to the control circuit for a desired time interval after the triggering signal has stopped to protect the control circuit from noise transients which could still be present after the stoppage of the triggering signal;

the power supply interrupting circuit comprising a first transistor controlled by a second transistor, the second transistor having a time constant circuit associated with it for providing said desired time interval; and the delay circuit connecting to the triggering signal through a differentiator.

7. The circuit according to claim 6 wherein the differentiator comprises a series connection of a resistor and capacitor for feeding through said trigger signal to said delay circuit.

8. A method for power removal from a control circuit of an application circuit where that application circuit, as a result of a triggering event, creates damaging noise in the control circuit, comprising the steps of:

providing a power supply for the control circuit;

supplying power from the power supply to the control circuit until initiation of the triggering event;

upon initiation of the triggering event, stopping power flow to the control circuit for a predetermined time delay sufficient so that after the triggering event has ceased said damaging noise which may still be present after the triggering event do not harm the control circuit, a signal representing the triggering event being converted to a sharp pulse which is input to a time delay circuit; and at the end of the time delay reconnecting power to the control circuit.

9. The method according to claim 8 wherein an RC circuit is provided to determine said time delay.

10. A method for power removal from a control circuit of an application circuit where that application circuit, as a result of a triggering event, can create damaging noise in the control circuit, comprising the steps of:

providing a power supply for the control circuit;

supplying power from the power supply to the control circuit until initiation of the triggering event;

upon initiation of the triggering event, stopping power flow to the control circuit for a predetermined time delay sufficient so that after the triggering event has ceased transient noises which may still be present after the triggering event do not harm the control circuit, the triggering signal being differentiated prior to feeding to a time delay circuit; and at the end of the time delay reconnecting power to the control circuit.

11. A method for protecting a control circuit in a device having a gas chamber ignited by an electrical arc from a high voltage source, the high voltage source electrical arc being initiated by an ignition circuit and wherein the ignition circuit is controlled by a microcontroller, comprising the steps of:

providing a power supply for the microcontroller;

feeding power to the microcontroller from the power supply until a triggering event based on generation of the high voltage arc for discharging the gas in the gas chamber occurs, said triggering event resulting in creation of damaging transient noises;

upon occurrence of the triggering event stopping power flow to the microcontroller for a defined time delay sufficiently long to protect the microcontroller from said damaging transient noises which may still be present after the triggering event is no longer present by feeding the triggering event through a differentiator to a time delay circuit; and reconnecting power to the microcontroller after said time delay.

12. The method according to claim 11 wherein said gas chamber is in a gas powered fastener gun where ignition of gas in the chamber is employed for propelling fasteners.

13. The method according to claim 11 wherein the triggering event utilized is based on an output from the ignition circuit.

14. The method according to claim 11 wherein the triggering event utilized is based on an output from the microcontroller to the ignition circuit for generating the high voltage arc through the high voltage step-up transformer.

15. A microcontroller power removal reset circuit, comprising:

an input for receiving a triggering event signal indicative of an event which can cause noise damage to a control circuit;

a differentiator between the input and a first stage for differentiating the event signal prior to feeding it to a time delay circuit, said first stage having said time delay circuit associated therewith for creating a predetermined time delay sufficiently long to protect the control circuit from damaging noises caused by, and which occur after disappearance of, the triggering event signal; and a second stage connected to the first stage functioning as a switch to connect and disconnect power from a power supply to the controller for said time delay.

16. The circuit according to claim 15 wherein the input connects through a first capacitor and a first resistor to a base of a second transistor, the second transistor base having a second resistor and a second capacitor connected thereto defining a time delay circuit, and wherein a base of a first transistor connects to a collector of the second transistor, the first transistor functioning as a switch where the collector connects the power supply through an emitter of the first transistor to the power supply.

17. A method for power removal from a control circuit of an application circuit where that application circuit, as a result of a triggering event for the application circuit, itself creates damaging noise in the control circuit, comprising the steps of:

provyding a power supply for the control circuit;

supplying power from the power supply to the control circuit until initiation of the triggering event;

upon initiation of the triggering event, stopping power flow to the control circuit for a predetermined time delay sufficient so that after the triggering event has ceased said damaging noise which may still be present after the triggering event does not harm the control circuit; and at the end of the time delay reconnecting power to the control circuit.

18. A method for protecting a control circuit in a device having a gas chamber ignited by an electrical arc from a high voltage source, the high voltage source electrical arc being initiated by an ignition circuit and wherein the ignition circuit is controlled by a microcontroller, comprising the steps of:

providing a power supply for the microcontroller;

feeding power to the microcontroller from the power supply until a triggering event based on generation of the high voltage arc for discharging the gas in the gas chamber occurs;

upon occurrence of the triggering event stopping power flow to the microcontroller for a defined time delay sufficiently long to protect the microcontroller from damaging transient noises caused by said triggering event which may still be present after the triggering event is no longer present; and reconnecting power to the microcontroller after said time delay.

* * * * *